United States Patent
Chou et al.

(10) Patent No.: US 11,404,425 B2
(45) Date of Patent: Aug. 2, 2022

(54) TEST KEY STRUCTURE

(71) Applicant: UNITED MICROELECTRONICS CORP., Hsin-Chu (TW)

(72) Inventors: Fang-Sheng Chou, Tainan (TW); Ching Chang, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 275 days.

(21) Appl. No.: 16/843,864

(22) Filed: Apr. 8, 2020

(65) Prior Publication Data

US 2021/0320109 A1   Oct. 14, 2021

(51) Int. Cl.
*H01L 27/11* (2006.01)
*G11C 29/12* (2006.01)

(52) U.S. Cl.
CPC .......... *H01L 27/1116* (2013.01); *G11C 29/12* (2013.01); *H01L 27/1104* (2013.01); *G11C 2029/1206* (2013.01)

(58) Field of Classification Search
CPC .................................................. H01L 27/1116
See application file for complete search history.

(56) References Cited

U.S. PATENT DOCUMENTS 7,468,283 B2   12/2008   Kwon
2018/0322916 A1*   11/2018   Huott ..................... G11C 29/12

* cited by examiner

*Primary Examiner* — Walter H Swanson
(74) *Attorney, Agent, or Firm* — Winston Hsu

(57) ABSTRACT

The present invention provides a test key structure, the test key structure a substrate, a plurality of test key cells disposed on the substrate, wherein each test key cell includes a first gate structure arranged along a first direction (X-axis), a first diffusion region, a second diffusion region, a connection diffusion region and a share contact arranged along a second direction (Y-axis), wherein the first gate structure crosses over the first diffusion region to form a pull-up transistor (PU), the second gate structure crosses over the second diffusion region to form a pull-down transistor (PD), and wherein the plurality of share contacts and the plurality of connection diffusion regions of the plurality of test key cells are electrically connected to each other.

12 Claims, 6 Drawing Sheets

TEST KEY STRUCTURE

BACKGROUND OF THE INVENTION

1. Field of the Invention

The present invention relates to a test key structure, and more particularly, to a test key located next to static random access memory (SRAM) cell.

2. Description of the Prior Art

Integrated circuits have evolved from a handful of inter connected devices fabricated on a single chip of silicon to millions of devices. Conventional integrated circuits provide performance and complexity far beyond what was originally imagined. In order to achieve improvements in complexity and circuit density, the size of the smallest device feature has become smaller with each generation of integrated circuits.

Increasing circuit density has not only improved the complexity and performance of integrated circuits but has also provided lower cost parts to the consumer. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility.

To increase product yield in mass production, most semiconductor manufacturers specifically design various types of test keys for finding defects in various component parts due to unexpected processing errors. Once a defective component is found, causes of failure can be investigated and later rectified.

SUMMARY OF THE INVENTION

The present invention provides a test key structure, the test key structure a substrate, a plurality of test key cells disposed on the substrate, wherein each test key cell includes a first gate structure arranged along a first direction (X-axis), a first diffusion region, a second diffusion region, a connection diffusion region and a share contact arranged along a second direction (Y-axis), wherein the first gate structure crosses over the first diffusion region to form a pull-up transistor (PU), the second gate structure crosses over the second diffusion region to form a pull-down transistor (PD), and wherein the plurality of share contacts and the plurality of connection diffusion regions of the plurality of test key cells are electrically connected to each other.

The present invention is characterized in that a plurality of test key cells are provided, which is located next to SRAM cells, wherein some elements in each test key cell are the same as the elements is the SRAM cell, so it can be fabricated simultaneously with the SRAM cell to save processing time. The completed test key cells are connected to each other through the contact layer and the share contacts, so multiple groups of test key cells can be tested simultaneously when testing components.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
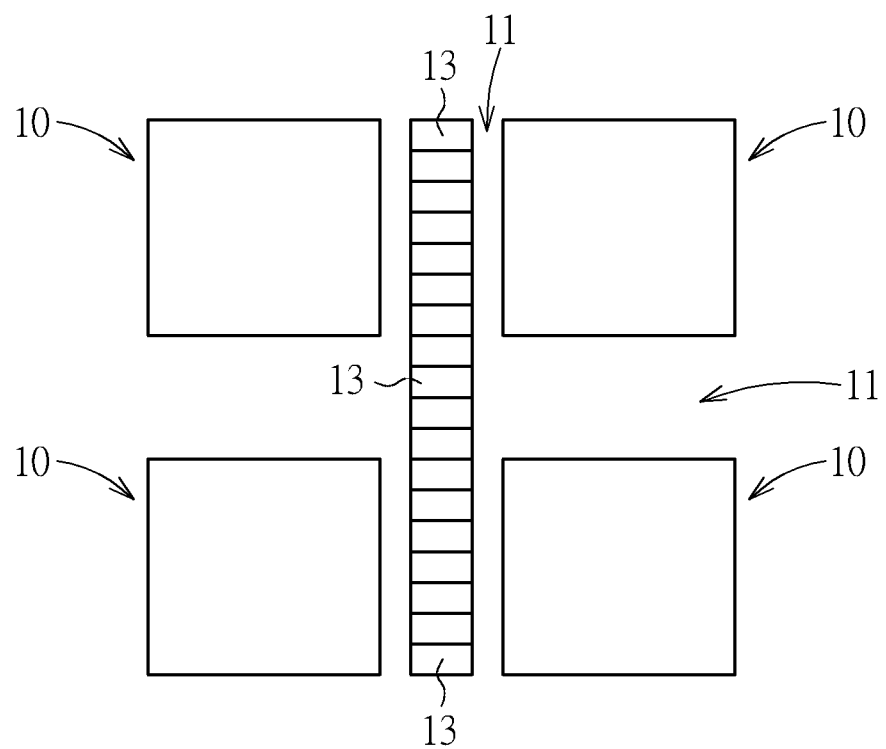
FIG. 1 shows the top view of the semiconductor structure according to a first preferred embodiment of the present invention.
Figure 2:
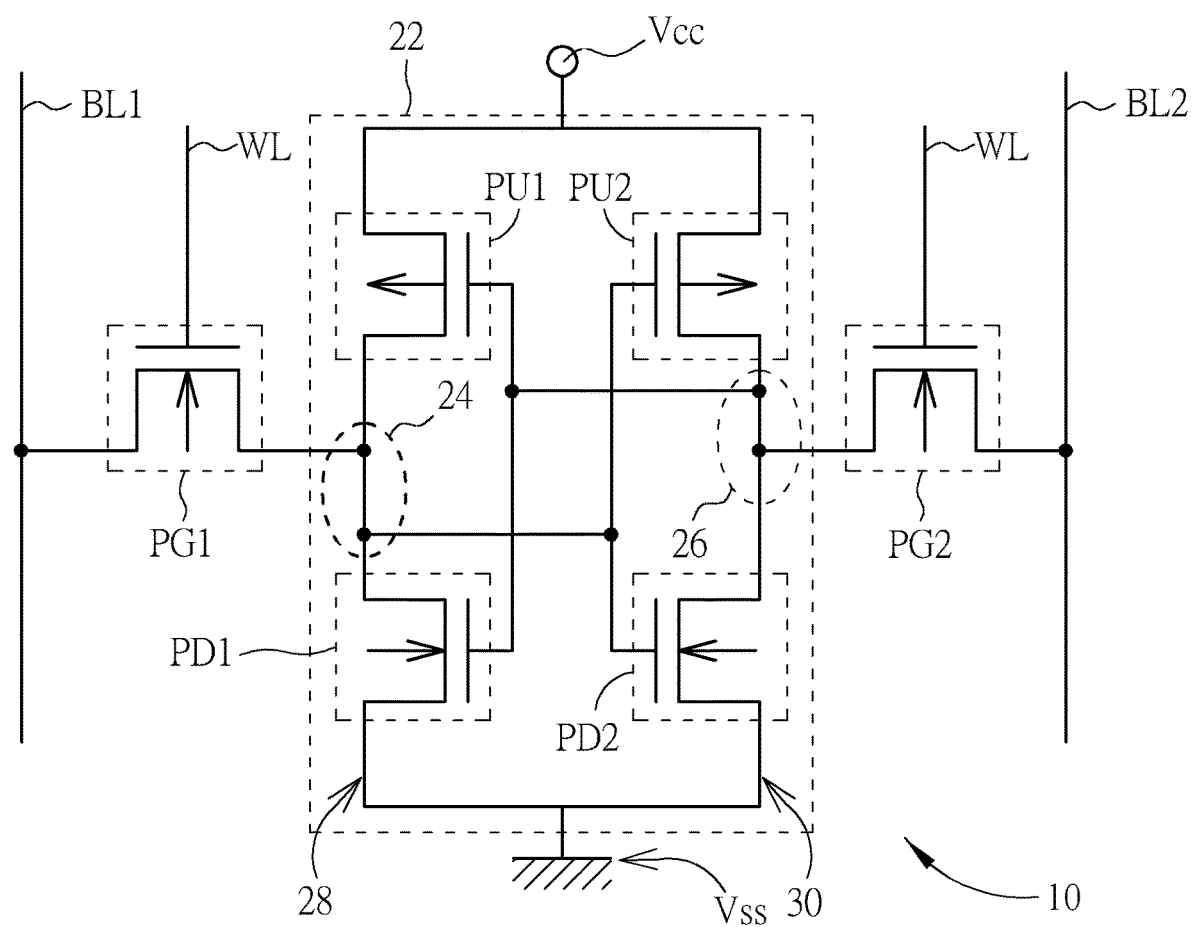
FIG. 2 shows a circuit diagram of a six-transistor SRAM (6T-SRAM) cell according to a first preferred embodiment of the present invention.
Figure 3:
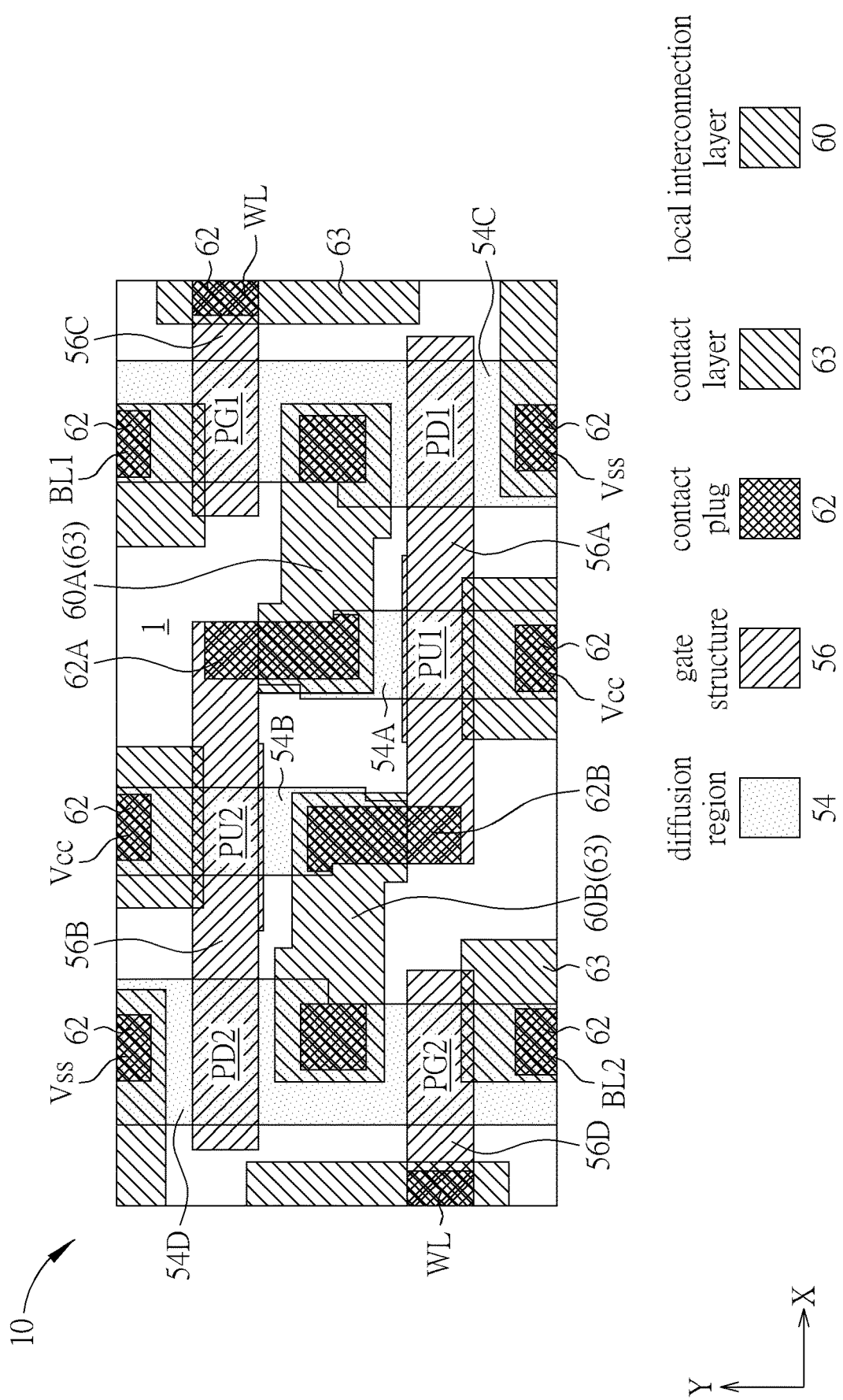
FIG. 3 shows the static random access memory (SRAM) layout of the present invention located in one of the SRAM cell.
Figure 4:
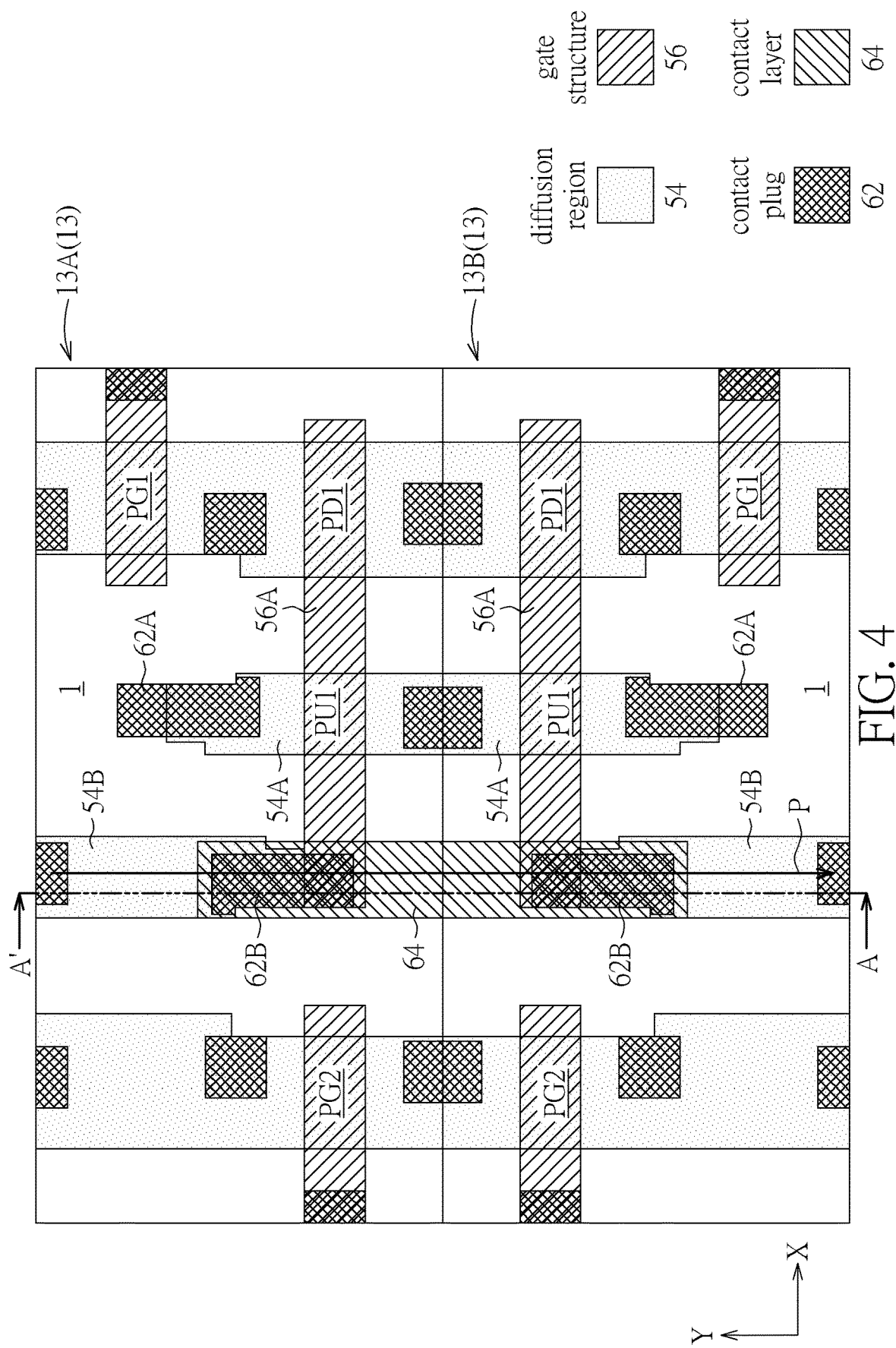
FIG. 4 shows the test key structures of the present invention located in two adjacent test key cells in the scribe line.

Please refer to FIG. 1, FIG. 2, FIG. 3 and FIG. 4. FIG. 1 shows the top view of the semiconductor structure according to a first preferred embodiment of the present invention, FIG. 2 shows a circuit diagram of a six-transistor SRAM (6T-SRAM) cell according to a first preferred embodiment of the present invention, FIG. 3 shows the static random access memory (SRAM) layout of the present invention located in one of the SRAM cell, and FIG. 4 shows the test key structures of the present invention located in two adjacent test key cells in the scribe line. As shown in FIG. 1, a substrate 1 is provided, a plurality of SRAM cells 10 are defined on the substrate 1. Preferably, the plurality of SRAM cells 10 are arranged in array, and a plurality of scribe lines 11 are defined on the substrate 1, each scribe line 11 is disposed between two adjacent SRAM cells 10. In addition, a plurality of test key cells 13 are disposed in the scribe lines 11.

As shown in FIG. 2 and FIG. 3, in this embodiment, each SRAM cell 10 including a six-transistors SRAM (6T-SRAM) cell, but not limited thereto. In another embodiment of the present invention, the SRAM cell may be an eight-transistors SRAM (8T-SRAM) cell, ten-transistors SRAM (10T-SRAM) cell or other types SRAM cell. In this embodiment, each 6T-SRAM cell 10 is composed of a first pull-up device PU1, a second pull-up device PU2, and a first pull-down device PD1, a second pull-down device PD2, a first access transistor PG1 and a second access transistor PG2. These six devices (transistors) constitute a set of flip-flops. The first and the second pull-up devices PU1 and PU2, and the first and the second pull-down devices PD1 and PD2 constitute a latch circuit 22 that stores data in the storage nodes 24 and 26. Since the first and the second pull-up devices PU1 and PU2 act as power load devices, they can be replaced by resistors. Under this circumstance, the static random access memory becomes a four-transistor SRAM (4T-SRAM). In this embodiment, the first and the second pull-up devices PU1 and PU2 preferably share a source/drain region and electrically connect to a voltage source (voltage node) Vcc, and the first and the second pull-down devices PD1 and PD2 share a source/drain region and electrically connect to a voltage source (voltage node) Vss.

Preferably, the first and the second pull-up devices PU1 and PU2 of the 6T-SRAM cell 10 are composed of p-type metal oxide semiconductor (PMOS) transistors; the first and the second pull-down devices PD1 and PD2, the first access transistors PG1 and the second access transistors PG2 composed of n-type metal oxide semiconductor (NMOS) transistors, but not limited thereto. The first pull-up device PU1 and the first pull-down device PD1 constitute an inverter, which further form a series circuit 28. One end of the series circuit 28 is connected to a voltage source Vcc and the other end of the series circuit 28 is connected to a voltage source Vss. Similarly, the second pull-up device PU2 and the second pull-down device PD2 constitute another inverter and a series circuit 30. One end of the series circuit 30 is connected to the voltage source Vcc and the other end of the series circuit 30 is connected to the voltage source Vss. The two inverters are cross-coupled to each other to storage data.

The storage node 24 is connected to the respective gates of the second pull-down device PD2 and the second pull-up device PU2. The storage node 24 is also connected to the drains of the first pull-down device PD1, the first pull-up device PU1 and the first access transistor PG1. Similarly, the storage node 26 is connected to the respective gates of the first pull-down device PD1 and first the pull-up device PU1. The storage node 26 is also connected to the drains of the second pull-down device PD2, the second pull-up device PU2 and the second access transistor PG2. The gates of the first access transistor PG1 and the second access transistor PG2 are respectively coupled to a word line (WL); the source of the first access transistor PG1 and the second access transistor PG2 are respectively coupled to a first bit line (BL1) and a second bit line (BL2).

In this embodiment, a 6T-SRAM cell 10 is disposed on the substrate 1, such as a silicon substrate or silicon-on-insulator (SOI) substrate. The substrate 1 may be a planar substrate having plurality of diffusion regions 54, or a plurality of fin structures (not shown) may be formed on the substrate 1. In this embodiment, take a 6T-SRAM with diffusion regions 54 as an example, but the present invention is not limited thereto. In another case, the SRAM comprising fin structures may also be comprised within the scope of the present invention. In addition, a shallow trench isolation (STI, not shown) is disposed between each diffusion regions 54.

In addition, a plurality of gate structures 56 are formed on the substrate 52. Each transistor (including the first pull-up transistor PU1, the first pull-down transistor PD1, the second pull-up transistor PU2, the second pull-down transistor PD2, the first pass gate transistor PG1 and the second pass gate transistor PG2 mentioned above) comprises a gate structure 56 crossing over at least one diffusion region 54, to form the transistors.

As shown in FIG. 2, in order to clearly define the position of each diffusion region 54 and each gate structure 56, the diffusion regions 54 are labeled to a first diffusion region 54A, a second diffusion region 54B, a third diffusion region 54C and a fourth diffusion region 54D. The gate structures 56 are labeled to a first gate structure 56A, a second gate structure 56B, a third gate structure 56C and a fourth gate structure 56D. It is to be understood that all of the first diffusion region 54A to the fourth diffusion region 54D belong to the diffusion region 54, and all of the first gate structure 56A to the fourth gate structure 56D belong to the gate structure 56.

In the present invention, each gate structure 56 is arranged in a first direction (e.g., an X-axis), and each diffusion region 54 is arranged in a second direction (e.g., Y-axis). Preferably, the first direction and the second direction are perpendicular to each other.

The first gate structure 56A crosses over the first diffusion region 54A to form the first pull-up transistor PU1, the second gate structure 56B crosses over the second diffusion region 54B to form the second pull-up transistor PU2, the first gate structure 56A crosses over the third diffusion region 54C to form the first pull-down transistor PD1, the second gate structure 56B crosses over the fourth diffusion region 54D to form the second pull-down transistor PD2, the third gate structure 56C crosses over the third diffusion region 54C to form the first access transistor PG1, and the fourth gate structure 56D crosses over the fourth diffusion region 54D to form the second access transistor PG2.

The present invention further comprises a first local interconnection layer 60A and a second local interconnection layer 60B arranged in a first direction. The first local interconnection layer 60A crosses over the first diffusion region 54A and the third diffusion region 54C. In the circuit diagram, the first local interconnection layer 60A represents the storage node 24. The second local interconnection layer 60B crosses over the second diffusion region 54B and the fourth diffusion region 54D. In the circuit diagram, the second local interconnection layer 60B represents the storage node 26.

In addition, a plurality of contact plugs 62 and a plurality of contact layers 63 are formed on the substrate 1, the contact plugs 62 and the contact layers 63 are used to connect different transistors (e.g., a gate of the second pull-up transistor PU2 and drain of the first pull-up transistor PU1 are connected to each other through the contact plug 62 and the contact layer 63), or used to connect the transistors to other elements (e.g., a source of the first pull-up transistor PU1 is connected to the voltage source Vcc). In FIG. 3, the elements that connected to each contact plug or each contact layer (for example, the voltage source Vcc, the voltage source Vss, the word line WL, the first bit line BL1, the second bit line BL2) are labeled on each contact plug 62 or each contact layer 63 directly, to clearly represent the corresponding elements of the contact plugs 62 and the contact layers 63. Preferably, the first local interconnection layer 60A and the second local interconnection layer 60B belong to the contact layers 63. In addition, the contact plug 62 electrically connected to the first local interconnection layer 60A is defined as the first share contact 62A, and the contact plug 62 electrically connected to the second local interconnection layer 60B is defined as the second share contact 62B.

Please refer to FIG. 4, there are a plurality of test key cell 13 in the scribe line 11. When viewed from the second direction (e.g., Y-axis), the patterns of the two adjacent test key cell 13 are symmetrical to each other. In FIG. 4, two adjacent test key cells 13 are shown, for example, a test key cell 13A and a test key cell 13B. As shown in FIG. 4, each test key cell 13 includes a pattern similar to the 6T-SRAM described above (FIG. 3). However, in each test key cell 13, the second gate structure 56B is not formed, and the shape of some contact layers 63 is changed, in particular, a contact layer 64 is formed, wherein the contact layer 64 connects two adjacent second share contacts 62B. Therefore, along the second direction (Y-axis), two adjacent test key cells 13 are connected to each other by the contact layer 64 and the second share contacts 62B. Further, from +Y to −Y direction of FIG. 4, a conductive path P is formed, which comprises: the second diffusion region 54B in the test key cell 13A, the second share contact 62B in the test key cell 13A, the contact layer 64 between the two test key cells 13, the second share contact 62B in the test key cell 13B and the second diffusion region 54B in test key cell 13B. In this embodiment, the second diffusion region 54B in each test key cell 13 is defined as a connection diffusion region, and each connection diffusion region and the contact layer 64 are arranged in one direction (e.g., Y-axis).

Besides, in each test key cell 13, the first pull-up transistor PU1, the first pull-down transistor PD1 and the second access transistor PG2 are aligned with each other along the first direction (such as X-axis). The first pull-down transistor PD1 and the first access transistor PG1 are aligned with each other along the second direction (such as Y-axis).

In order to simplify the drawing, some elements are omitted in FIG. 4 and are not shown, for example, the first local inter-connection layer 60A, the second local inter-connection layer 60B and the contact layers 63 (except for the contact layer 64) are not shown in FIG. 4. However, the positions of these elements can be correspondingly referred to FIG. 3.

Besides, each test key cell 13 differs from the SRAM cell 10 in that the test key cell 13 does not include the second gate structure 56B, so as shown in FIG. 4, compared with the SRAM cell 10 including at least six transistors, there are only four transistors in each test key cell 13 (that is, the first pull-up transistor PU1, the first pull-down transistor PD1, the first access translator PG1 and the second access translator PG2), without including the second pull-up translator PU2 and the second pull-down translator PD2.

Figure 5:
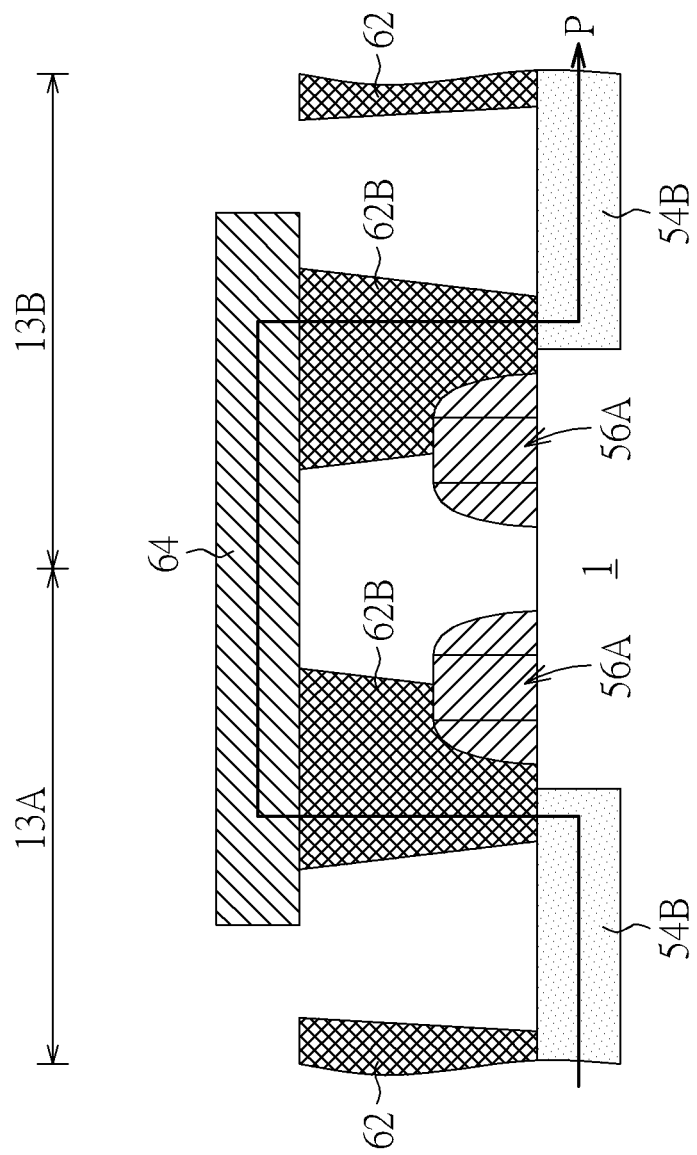
FIG. 5 shows a sectional view taken along the section line A-A' in FIG. 4.

Please refer to FIG. 5, which shows a sectional view taken along the section line A-A' in FIG. 4. It is worth noting that in this embodiment, the second share contact 62B contacts the second diffusion region 54B and part of the first gate structure 56A simultaneously.

Figure 6:
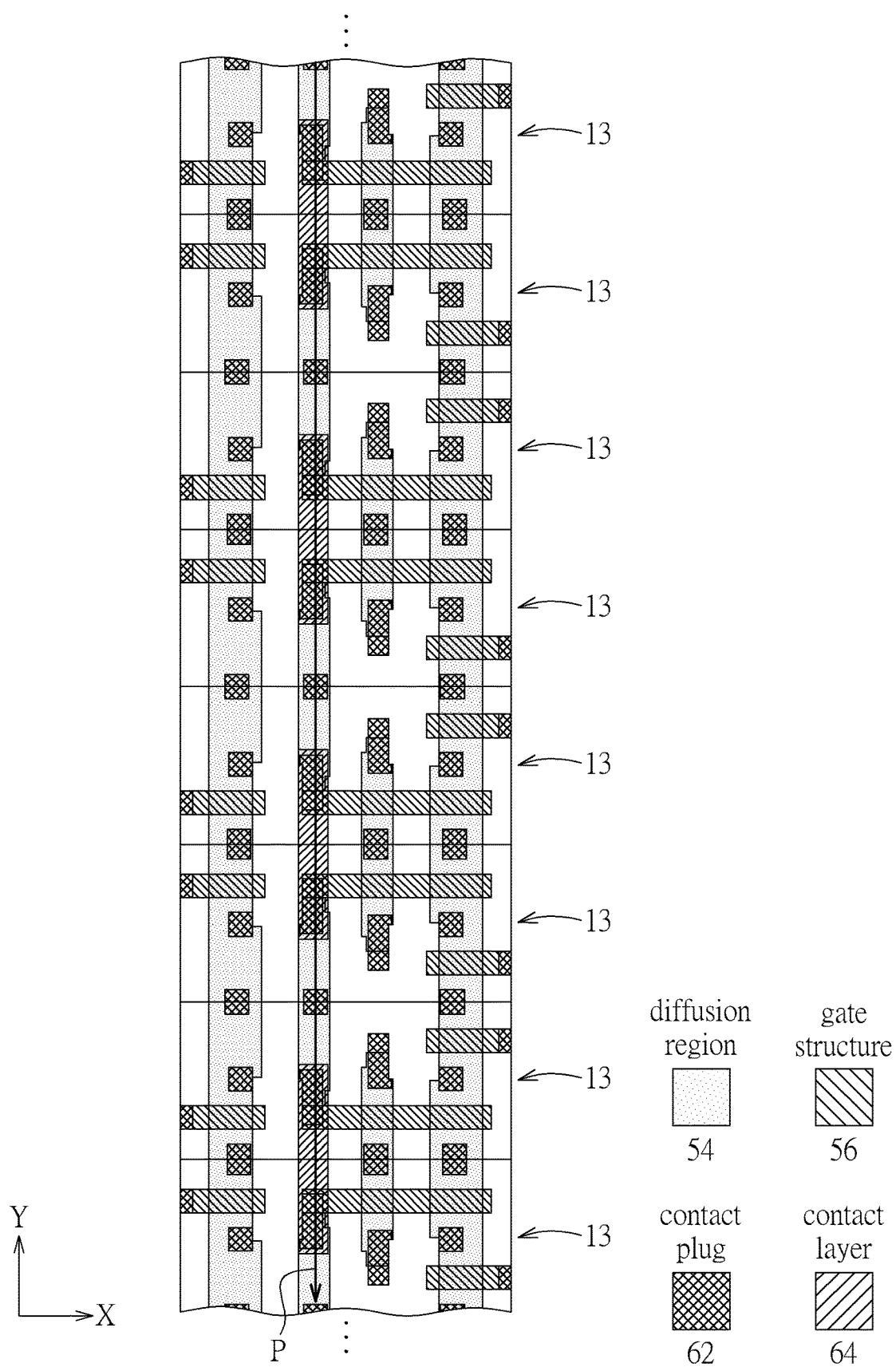
FIG. 6 shows a plurality of test key cells arranged along the second direction.

FIG. 6 shows a plurality of test key cells arranged along the second direction (such as Y-axis). In this embodiment, each test key cell 13 is electrically connected to each other, and a conductive path P is formed by the contact layers 64 and the second share contact 62B in each test key cell 13. Although there are eight test key cells 13 shown in FIG. 6, however, in other embodiments, more test key cells may be connected to each other. In the actual test step using test key cell, two conductive pads (not shown) can be respectively formed at both ends of the conductive path P, then a voltage can be introduced from one of the conductive pads, and the voltage read by the conductive pad at the other end can be observed. If abnormal voltage drop occurs, it means that some components (elements) in the conductive path may have defects. Therefore, the repair can be carried out immediately.

In summary, the present invention is characterized in that a plurality of test key cells are provided, which is located next to SRAM cells, wherein some elements in each test key cell are the same as the elements is the SRAM cell, so it can be fabricated simultaneously with the SRAM cell to save processing time. The completed test key cells are connected to each other through the contact layer and the share contacts, so multiple groups of test key cells can be tested simultaneously when testing components.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A test key structure, comprising:
a substrate;
a plurality of test key cells disposed on the substrate, wherein each test key cell includes a first gate structure arranged along a first direction (X-axis), a first diffusion region, a second diffusion region, a connection diffusion region and a share contact arranged along a second direction (Y-axis), wherein the first gate structure crosses over the first diffusion region to form a pull-up transistor (PU), the first gate structure crosses over the second diffusion region to form a pull-down transistor (PD), and wherein the plurality of share contacts and the plurality of connection diffusion regions of the plurality of test key cells are electrically connected to each other.

2. The test key of claim 1, wherein the first direction and the second direction are perpendicular to each other.

3. The test key of claim 1, wherein the connection diffusion region of each test key cell and the share contact are aligned with each other along the second direction.

4. The test key of claim 1, wherein each test key cell further comprising a second gate structure, wherein the second gate structure crosses over the second diffusion region to form a first access transistor (PG1).

5. The test key of claim 4, wherein each test key cell further comprising a third gate structure, wherein the third gate structure crosses over a third diffusion region to form a second access transistor (PG2).

6. The test key of claim 4, wherein the PG1 and the PD are aligned with each other along the second direction.

7. The test key of claim 5, wherein each test key cell comprises four transistors.

8. The test key of claim 5, wherein the PU, the PD and the PG2 are aligned with each other along the first direction.

9. The test key of claim 1, wherein each share contact comprises vertical conductive plugs and a horizontal conductive layer.

10. The test key of claim 9, wherein each vertical conductive plug contacts the first gate structure and the connection diffusion region simultaneously.

11. The test key of claim 1, further comprising a plurality of SRAM cells disposed on the substrate, wherein each SRAM cell comprises at least 6 transistors, 8 transistors or 10 transistors.

12. The test key of claim 1, wherein adjacent test key cells of the plurality of test key cells are symmetrical to each other.

* * * * *